Figure 1:
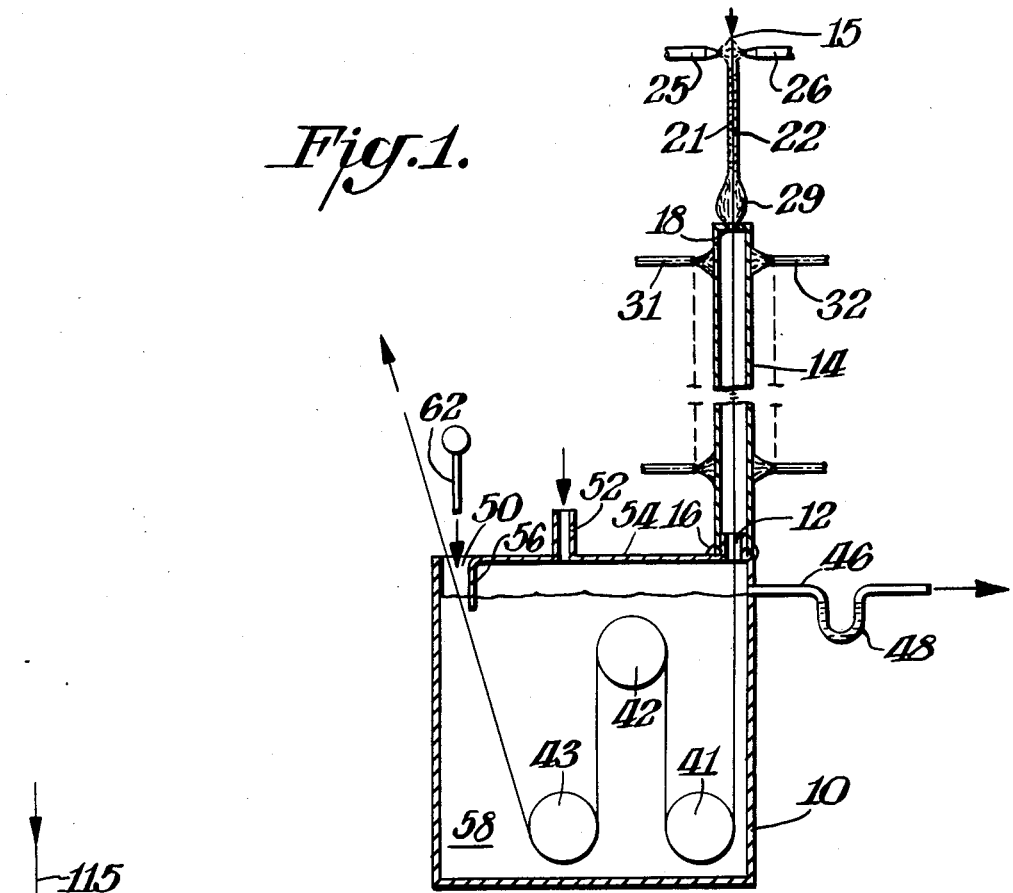

United States Patent [19]

Baldi

[11] Patent Number: 4,708,913

[45] Date of Patent: Nov. 24, 1987

[54] PYROPHORIC PROCESS AND PRODUCT

[75] Inventor: Alfonso L. Baldi, Wynnewood, Pa.

[73] Assignee: Alloy Surfaces Company, Inc., Wilmington, Del.

[21] Appl. No.: 281,405

[22] Filed: Jul. 8, 1981

Related U.S. Application Data

[63] Continuation-in-part of Ser. No. 230,333, Feb. 2, 1981, Pat. No. 4,347,267, and a continuation-in-part of Ser. No. 191,780, Sep. 29, 1980, abandoned, and a continuation-in-part of Ser. No. 172,938, Jul. 28, 1980, abandoned, and a continuation-in-part of Ser. No. 172,671, Jul. 28, 1980, Pat. No. 4,435,481, and a continuation-in-part of Ser. No. 25,456, Mar. 30, 1979, Pat. No. 4,349,612, said Ser. No. 172,671, said Ser. No. 25,456, each is a continuation-in-part of Ser. No. 963,313, Nov. 27, 1978, abandoned, said Ser. No. 230,333, is a continuation-in-part of Ser. No. 89,949, Oct. 31, 1979, abandoned.

[51] Int. Cl.$^4$ .................. C06B 27/00; C06B 33/00
[52] U.S. Cl. .................... 428/607; 149/5; 149/6; 149/22; 149/108.6; 44/3.1
[58] Field of Search ............ 428/606, 607, 608, 546, 428/547, 549, 550, 564; 75/246; 149/37, 5, 6, 119, 109.2, 108.6, 108.2, 22, 121; 252/477 Q, 610, 611; 44/3 R, 3 C

[56] References Cited

U.S. PATENT DOCUMENTS

| | | | |
|---|---|---|---|
| 2,149,694 | 3/1939 | Vollrath | 149/108.2 |
| 2,205,552 | 6/1940 | Arnold | 252/477 Q |
| 2,530,493 | 11/1950 | Van Loenen | 44/3 R |
| 3,064,640 | 11/1962 | Donath | 44/3 R |
| 3,068,157 | 12/1962 | Vielstich | 204/228 |
| 3,160,537 | 12/1964 | Trafton | 149/37 |
| 3,257,801 | 6/1966 | Martinez et al. | 149/22 |
| 3,311,459 | 3/1967 | Francis et al. | 44/3 R |
| 3,347,721 | 10/1967 | Jago | 149/37 |
| 3,379,635 | 4/1968 | Doehren | 204/284 |
| 3,516,880 | 6/1970 | Johnson | 149/37 |
| 3,563,915 | 2/1971 | Eisenhaver | 252/477 Q |
| 3,637,437 | 1/1972 | Goldberger | 428/600 |
| 3,751,308 | 8/1973 | Bishop | 149/37 |
| 3,838,070 | 9/1974 | Thomas | 252/477 Q |
| 3,989,909 | 10/1976 | Macri | 149/22 |
| 4,019,932 | 4/1977 | Schroeder | 149/37 |
| 4,028,266 | 6/1977 | Langere | 252/610 |
| 4,093,424 | 6/1978 | Yoshida et al. | 44/3 C |
| 4,166,805 | 9/1979 | Jowett | 252/430 |
| 4,176,091 | 11/1979 | Inaba | 252/477 Q |
| 4,255,157 | 3/1981 | Yamaguchi et al. | 44/3 C |
| 4,292,208 | 9/1981 | Baldi | 428/682 |

FOREIGN PATENT DOCUMENTS 1344609 1/1974 United Kingdom .................. 149/22

OTHER PUBLICATIONS

"Initiation and Propogation of Combustion in Gasless Pyrotechnics", Boddington, T., et al., Symp. Chem. Probl. Connected Stab. Explos., 1979, Chem Abstracts, 95:83154p.

"Heatsource for Thermal Batteries", Prentice, Jack L., U.S. 4,158,084, Jun. 1979, Chemical Abstracts, 91:94415t.

"Treatment of Aluminum Anodic Film with Ethanolamine-Containing Aqueous Solutions", Nakasugawa, Chemical Abstracts 78:51778c, 1972.

"Treating Aluminum Articles for Sealing ", Yamada et al., Chemical Abstracts, 81:174,990k, 1974.

"Aliphatic Amine-Containing Liquid Exposives", Fujihara et al., Chemical Abstracts, 84:7212p, 1976.

Primary Examiner—L. Dewayne Rutledge
Assistant Examiner—John J. Zimmerman
Attorney, Agent, or Firm—Connolly and Hutz

[57] ABSTRACT

Metals like iron and nickel are pyrophorically activated by continuous or batch treatment. Activated metal can be coated with material that increases, or tempers by partial blocking, pyrophoric action. Pyrophoric powder can be compacted with ignitable powders or fibers to produce self-supporting bodies having different degrees of pyrophoric activity.

3 Claims, 4 Drawing Figures

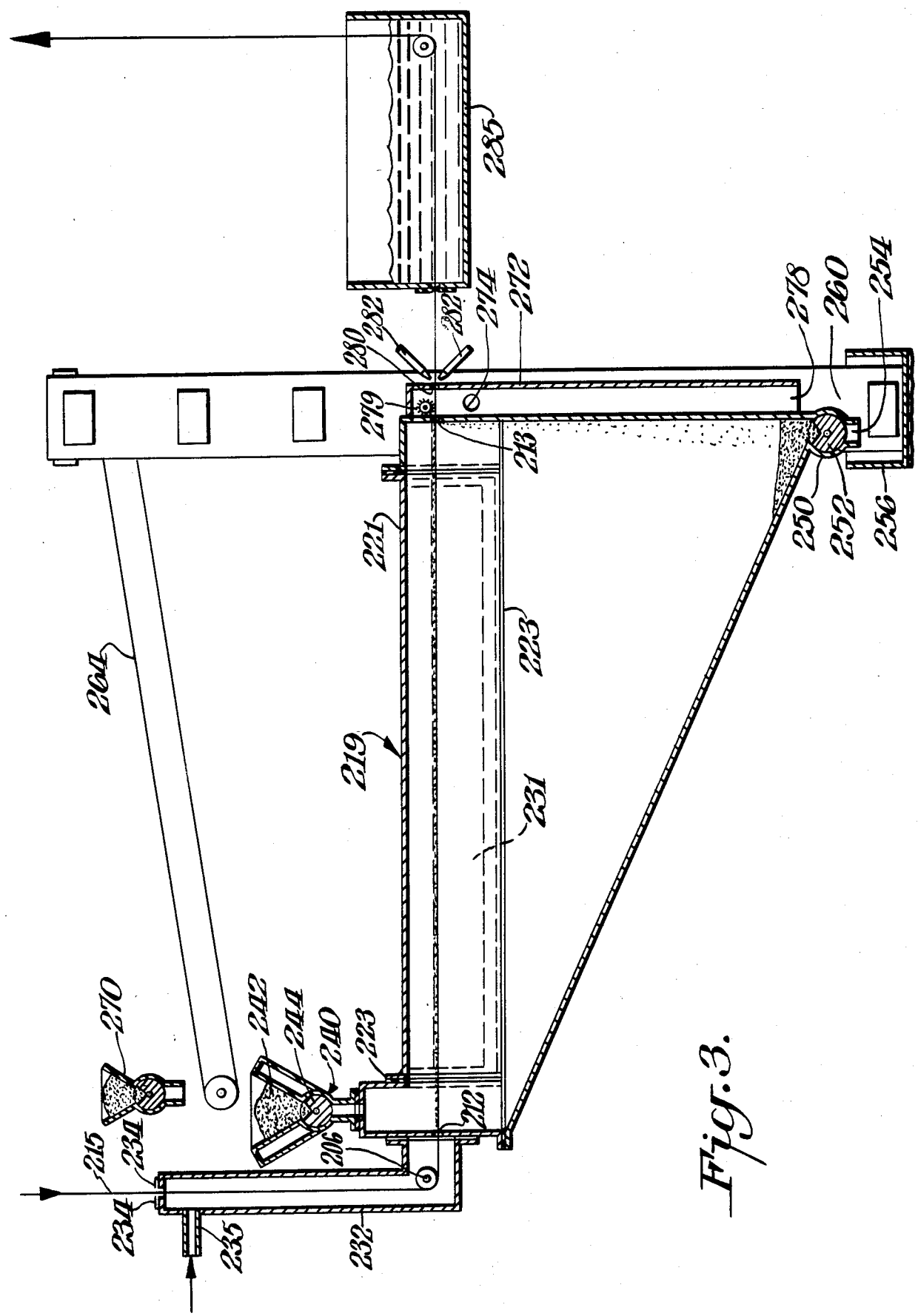

PYROPHORIC PROCESS AND PRODUCT

This Application is a continuation-in-part of applications Ser. No. 230,333, filed Feb. 2, 1981, now U.S. Pat. No. 4,347,267, and Ser. No. 191,780, filed Sept. 29, 1980, now abandoned, and Ser. No. 172,938, filed July 28, 1980, now abandoned and Ser. No. 172,671, filed July 28, 1980, U.S. Pat. No. 4,435,481, and Ser. No. 25,456, filed Mar. 30, 1979, now U.S. Pat. No. 4,349,612, and the last two of which are in turn continuations-in-part of application Ser. No. 963,313 filed Nov. 27, 1978 and subsequently abandoned. Ser. No. 230,333 is a continuation-in-part of prior application Ser. No. 89,949 filed Oct. 31, 1979 and subsequently abandoned.

The present invention relates primarily to the making and storage of pyrophoric articles, as well as to some of the products thus produced. It is in part a supplement to the invention of Ser. No. 172,671, the contents of which are incorporated herein as though fully set forth.

Among the objects of the present invention is the provision of improved methods for preparing pyrophoric articles.

An additional object of the present invention is the provision of novel pyrophoric products.

Figure 2:
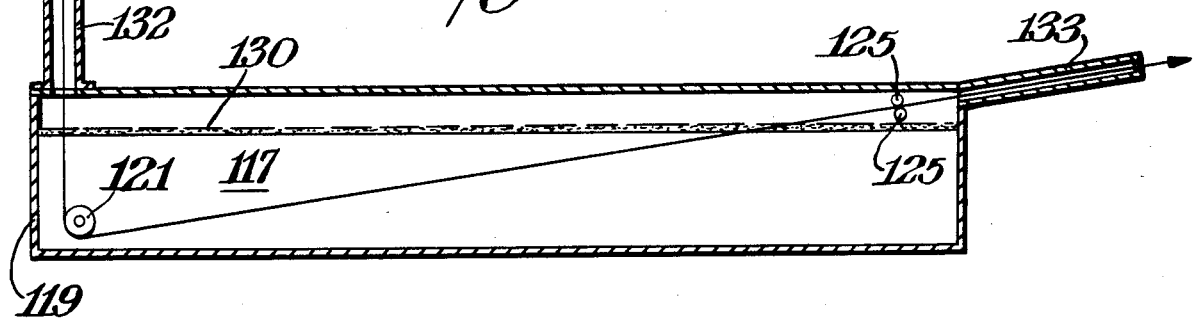
Figure 4:
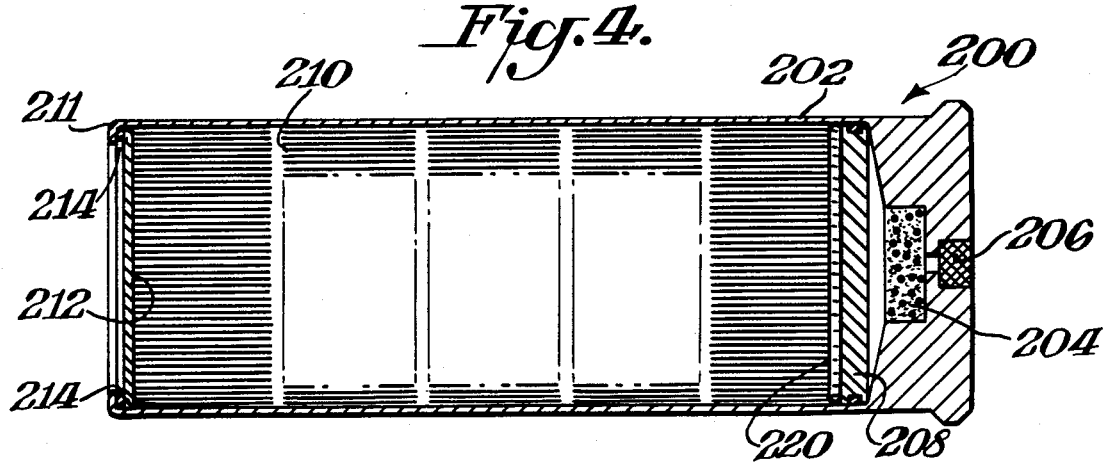

The foregoing as well as further objects of the present invention will be more fully appreciated from the following description of several of its exemplifications, reference being made to the accompanying drawings, wherein FIG. 1 is a vertical sectional view of an apparatus for carrying out a process of the present invention;

FIGS. 2 and 3 are similar views of portions of two different modified apparatuses for the same purpose; and FIG. 4 is a similar view of a pyrophoric product exemplifying the present invention.

According to the present invention an elongated metal foil is pyrophorically activated on a continuous basis by moving the foil through a pre-coating station at which coating means applies to the surface of the foil a layer containing diffusion-coating metal, then passing the foil slowly through a hot diffusion-coating zone to effect the diffusion coating of metal from that layer into the surface of the foil, and then passing the foil slowly through a leaching station at which at least some of the diffused-in metal is dissolved out of the foil.

The diffusion-coating metal in the pre-coating layer can be in the form of fine particles, with or without diffusion coating activator. Alternatively the diffusion-coating metal can be in contiguous form such as a molten layer or a flame-sprayed layer or an electrolytic or non-electrolytic plating, or a sputtered layer, or a separate foil, or the like.

It is explained in the parent applications that for some uses it is desirable to make long lengths of pyrophorically-activated foil. Examples of techniques for this purpose are given in the earlier applications.

The present FIG. 1 shows a modified technique for the same purpose. A covered tank 10 has a foil inlet 12 over which is placed a vertical tube 14. The lower end of tube 14 can be sealed against the tank as by a painted-on high-temperature sealant 16 such as a silicone. The upper end of tube 14 has its mouth partly closed by inwardly-directed flanges to leave an entrance slot 18 for the foil 15 to be treated. The slot is substantially larger than the foil dimensions, to allow for coatings on the foil faces. These coatings are shown at 21, 22 and are illustrated as applied by nozzles 25, 26 directed at the respective foil faces.

Around tube 14 are located sets of heaters, such as gas burners 31, 32, to heat the tube and the foil within it, to diffusion-coating temperatures.

Tank 10 is fitted with guide rollers 41, 42, 43, a liquid overflow 46 that is in turn provided with a trap 48, an outlet 50 for the treated foil, and a flushing gas inlet 52. The tank's cover 54 is bent down at the outlet 50 to form a weir 56 that dips below the surface of the liquid 58 which the tank holds. A controllable nozzle 62 directs make-up or fresh liquid into the opening 50 and against the foil emerging from it.

In operation, an elongated foil 15 or pair of foils adhered back-to-back, is threaded through the apparatus so that the foil emerging at 50 can be wound upon a reel and the rotation of the reel pulls the foil through the apparatus. The heaters 31, 32 are placed in operation, and the tank filled with 20 weight % NaOH solution in water, preferably also having dissolved in it about 2.5 weight % $SnCl_2.2H_2O$. A flushing stream of argon or the like can be started into inlet 52, and the foil pulling started as the inside of tube 14 reaches the desired temperature which can be selected as low as about 800° F. or as high as about 1500° F. Before the foil pulling begins, nozzles 25, 26 are started so that the desired coatings 21, 22 are applied to the foil before it enters slot 18.

Where these coatings can be heavy, as for example when the coatings are slurries of the following formulation Aluminum powder: 12%
Alumina powder: 48%
$AlCl_3$: 1%
Poly(ethylacrylate): 2%
Methyl chloroform: 37% the nozzles can be operated continuously while the tape is slowly pulled through the apparatus. The tape may spend as much as an hour or more in traversing tube 14, so that the use of a tube only 3 feet long may call for a 0.6 inch per minute rate of foil movement.

Where the coatings 21, 22 are relatively thin, as for example flame-sprayed aluminum, it may be preferred to operate the nozzles 25, 26 intermittently and to pull the tape intermittently in steps synchronized with the nozzle operation. This makes it unnecessary to apply the coatings at the impractical extremely slow rate needed when applied uninterruptedly.

After the gas flush has completely flushed out the internal atmosphere in the apparatus, a stream of hydrogen can be substituted for the flushing gas, and the hydrogen is then ignited as it begins to escape through slot 18. The burning hydrogen is shown by flame 29.

As the foil is pulled down through tube 14, the aluminum in coatings 21, 22 diffuses into the foil faces, as explained in the parent applications. The foil then gets pulled into the liquid 58 in tank 10 and that liquid attacks the diffusion case to leach out aluminum. This leaching action liberates substantial quantities of hydrogen and the flow into gas inlet 52 can be adjusted to compensate. The leaching action preferably takes at least about 30 minutes, so that the guide rollers 42 and 43 can be adjusted to provide the appropriate dwell of the foil in the tank. Roller 41 is preferably arranged to carry the foil to the maximum tank depth directly under slot 18, in order to avoid premature flexing of the diffusion-coated foil which is very brittle until much of the leaching is completed.

Fresh leach solution can be gradually introduced at 62 to replenish the tank. By having the fresh solution wash over the foil emerging at 50, the leach residues in the liquid dragged out by that foil are washed off. Coatings 21,22 containing aluminum chloride or other diffusion activator can cause halides to accumulate in the leach liquid 58, and these are also washed off at the same time.

The treated foil wound up on the wind-up reel is strongly pyrophoric, but is wet with sufficient caustic solution to block its pyrophoric action. The blocking effect is improved if the foil is rinsed with water and then wet with glycerine, ethylene glycol, or other liquid disclosed in U.S. Pat. No. 3,379,635.

Argon may be mixed with or substituted for the hydrogen introduced at 52. This will reduce the burning intensity of the flame 29, or completely extinguish the flame. Sufficient argon can thus be introduced to make sure that the hydrogen content of the gases discharged at 18 is below the explosive limit and that these gases can be safely vented.

In FIG. 2 a foil 115 is introduced into a body 117 of molten aluminum contained in tank 119, guided around roller 121 and then withdrawn without further flexing. As or just after the foil leaves the surface of the molten aluminum, it is given a doctoring or wiping treatment to remove all or nearly all of the liquid aluminum still adhering to it. In the figure, a pair of squeeze rolls 125 spring biased toward each other is positioned so that the emerging foil is passed between these rolls and the liquid aluminum on it is squeezed out. The emerging foil can then be passed through a leach tank as in FIG. 2 of parent application Ser. No. 172,671.

The dwell of the foil in the liquid aluminum keeps the foil at a temperature at least as high as about 1200° F., and this causes some of the aluminum to diffuse into the surface of the foil. At these temperatures less than an hour's immersion will yield a diffusion case that, after leaching, privides very good pyrophoricity. The movement of the foil can be continuous or intermittent.

As is well known the molten aluminum can be covered with a layer of flux 130 that helps keep the aluminum from contact with the ambient air and also helps the aluminum wet the entering foil. Cryolite makes an effective flux, as do other fluoride-containing salts. FIG. 2 also shows protector tubes 132, 133 surrounding the entering and emerging foil, as well as an inlet 135 through which an inert atmosphere such as argon can be flushed through the apparatus to further protect the molten aluminum and also protect the foil.

The apparatus of FIG. 3 coats only one face of a foil 215. As in FIG. 2, foil 215 is fed downwardly through a protector tube 232 having resilient sealing lips 234 at its entrance and a gas flushing inlet 235. The foil passes around internal roller 206, which can be water-cooled, and then through the upper portion of retort 219. Slots 212 and 213 at opposite ends of the retort, provide the entranceway and exit for the foil. Gas burners indicated by the dash lines 231 are placed alongside the foil path through the retort to heat that path to diffusion coating temperature.

Just inside entranceway 212, the retort top is fitted with a powder feed 240 that opens into a hopper 242 in a gas-tight manner. The hopper can have a liquid-cooled jacket. A rotating pocketed roller 244 in the feed 240 drops pocketfuls of diffusion coating powder onto the incoming foil as it starts its run through the retort. Exit slot 213 provides only a little clearance, not more than about 10 mils, for the emerging foil, and so causes the powder on the foil to be scraped off and drop to the bottom of the retort. The retort bottom is shown as sloped to cause the dropping powder to collect in a trap 250 containing a gas-tight powder-discharging pocketed roller 252. Under the outlet 254 of this trap there is a sloping trough 256 that receives the discharging powder and collects it at a low point at which the bottom of a bucket elevator 260 lifts bucketfuls of the collected powder and drops them onto an overhead conveyor 264 from which they are returned to feed hopper 242. A separate powder feed 270 drops onto conveyor 264 or into hopper 242, make-up powder which replenishes the recycling powder, particularly the activator, to compensate for losses and for depletion due to the diffusion coating.

Gases will leak from the retort through exit slot 213, and a hood 272 is placed around that slot to guide the gases to a draw-off conduit 274. The lower end of the hood is left open at 278 over trough 256, to permit recovery of powder that isn't scraped off by the edges of slot 213. A fixed or rotating bristle roller 279 can be fitted in the hood to remove such powder.

A foil exit slot 280 is also provided in the hood, and that slot can be flooded with a spray of water or other convenient liquid from nozzles 282, to cool the foil passing through it and also help make slot 280 gas tight. The cooled foil is then passed through a leaching tank 285 as in FIG. 2 of parent application Ser. No. 172,671.

Retort 219 can have its heated portion 221 thermally insulated from the remainder of the retort, as by making that portion a separate piece of metal with flanged connections 223 to the surrounding portions of the retort and with insulating gaskets of asbestos or the like sandwiched between the flanges. Similar insulation can be provided at the mountings for the powder feed 244 as well as for hood 272.

Instead of using pure or almost pure aluminum in the diffusion coating powder or as the molten metal 117, a mixture of aluminum with some zinc can be used. The use of pure or almost pure zinc yields a product having reduced pyrophoricity ard so is not preferred. Stronger and/or hotter caustic solutions should also be used with pure or almost pure zinc, to keep from excessively extending the leaching time. Zinc has a relatively high volatility and is accordingly best used at temperatures below 1200° F.

Sprayed metal coatings 21, 22 of FIG. 1, can have aluminum and zinc in any proportions inasmuch as both metals can be simultaneously supplied to a flame-spray gun, for example. The molten metal bath 117 of FIG. 2 does not have such a wide range because zinc and aluminum are not miscible in all proportions.

Where the foil being treated is iron or an alloy containing at least 40% iron by weight, it is also helpful to have a little tin in the aluminum and/or zinc. As described in parent application Ser. No. 172,671, the presence of stannite ions in the leach solution makes the leaching of iron foils more uniform and also sharply reduces the degradation of their pyrophoricity when kept in the leach solution. Tin is leached out by hot leaching baths and forms stannite in them. As little as 1 mol of stannite ion for every 70 mols of NaOH provides considerable improvement, although it is preferred to have at least 1 stannite mol for every 50 mols NaOH. A leaching solution saturated with stannite is also very effective.

Iron foils can also have alloying ingredients such as carbon, nickel and chromium. A chromium content of 12 or more weight % yields activated foils that are not pyrophoric.

While the movement of the foil through the diffusion-coating zone and through the leaching bath is necessarily of long duration, the passage through the pre-coating station can be made rapid. Thus some slack in the tape may be provided between the pre-coating station and the diffusion zone, so that intermittent rapid movements of the tape can be made through the coating zone, while keeping the movement through the diffusion zone quite slow, as in a sound and movie projector.

The foils 15 and 115 can each be back-to-back pairs adhered together by adhesive that is thermally decomposed during the diffusion heating step. Acrylic adhesives or any other resin adhesives are suitable for this purpose, and after the adhered-together foils have completed the diffusion, they can be readily separated from each other inasmuch as the decomposed adhesive does not hold them together very well. A little residue of decomposed adhesive on the back of an activated foil does no harm and generally does not have to be removed for the foil to develop its full pyrophoricity.

The diffusion coating in FIGS. 1, 2 and 3 can be effected at temperatures of 1600° F. or below. The lower the temperature the longer the diffusion time needed. Only about 15 minutes dwell at 1600° F. is adequate to develop good pyrophoricity but it is preferred to use temperatures of 1400° F. or below and dwells at least 30 minutes long.

For use as radar and heat-seeking missile decoys, the elongated activated foil is cut into short length, about 1 inch long and about ½ inch wide. These are then stuffed into a flare-type shell, as illustrated for example in FIG. 4. This shell 200, has the usual casing 202, propellent 204, primer 206, and piston 208. The casing interior is packed with stacks 210 of activated foil strips held in place by the turned-in casing edge 211 or the like. The strips are packed under argon or other inert atmosphere, or even under the vapors of acetone or propylene oxide, both of which are effective preserving barriers to prevent access to oxygen, and the casing mouth is covered by a disc 212 that carries a peripheral sealing gasket 214. Vacuum packing can also be used.

The shell of FIG. 4 also includes a pad 220 containing a 20% solution of ammonium nitrite in water. The pad is a heat-sealed plastic envelope with walls about 4 to 8 mils thick, so that the pad ruptures when the shell is fired. This blows the ammonium nitrite solution over the pyrophoric strips and causes the mixture to flare up to a very high temperature briefly, upon discharge.

The ammonium nitrite can also be used to improve the way in which pyrophoric metals ignite combustibles like cigarettes or charcoal or start a fireplace fire. Building a wood and paper fire starter assembly directly over a few strips of activated iron or nickel foil, enables the starting of a fire by merely squirting a few cubic centimeters of ammonium nitrite solution onto the exposed portions of the activated faces.

It is generally desired to activate foils that are extremely thin, inasmuch as this gives a product with the greatest activity per unit volume. Where thin foils would be too fragile for dependably passing through the sequence of activation steps, thicker foils can be used and after activation the foil thickness reduced as by chemical milling. The activation is preferably confined to one face of the foil, as explained in the parent applications, so the opposite face is available for chemical milling by nitric or hydrochloric acid for example. The activated face is first protected as by a pressure-sensitive tape that is adhered over it, to keep the milling acid from contacting it. In this way a foil originally two mils thick can be activated and then reduced in thickness to correspond to an activated foil produced from one originally one mil thick. The chemical milling can also reduce the activated foil thickness to correspond to foils originally less than one mil thick.

As described in the parent applications, the pyrophoric action of the pyrophoric members can be increased by placing in intimate contact with the member, a solid or liquid that undergoes an exothermic reaction when heated. Metals like magnesium and titanium can thus be adhered to a pyrophoric foil as by placing a magnesium ribbon over an activated foil and passing the assembly between a pair of pressure rollers. Powdered materials such as magnesium, titanium, manganese, zirconium, carbon, aluminum or boron can be dispersed in a volatile liquid and the dispersion applied to an activated member and dried. Commercially available boron powder is very effective when dispersed in an alcohol such as ethanol.

The pyrophoric combinations of the present invention can take other forms. Thus a 5-mil thick felt of boron or carbon fibers or ordinary paper or cotton cloth can be coated on one or both sides with a paste of pyrophorically activated iron or nickel powder, and the coated felt subjected to a drying and if desired a sintering treatment to form a self-supporting sheet in which the pyrophoric particles are embedded in the inter-fiber spaces. A boron felt weighing about 0.1 gram per square centimeter of gross surface (as measured with a ruler), carrying 0.2 gram pyrophoric iron powder per square centimeter of gross surface, generates a very large amount of heat when exposed to the atmosphere. Ordinary steel wool also makes a very effective porous substrate for impregnation.

The activated iron powder is readily prepared by activating the surface of an iron foil or sheet and scraping off the activated layer. Raney iron can also be used. Activated nickel powder can be prepared the same way but the scraping is much rore difficult and it is accordingly preferred to use Raney nickel powder or to leach powdered Ni Al$_3$ with alkali.

Instead of making a pyrophoric combination by starting with a sheet of felted fibers, the starting material can be a porous sheet or disc prepared as by a sintering operation so as to contain at least about 20% voids. The voids are then impregnated with pyrophoric or combustible particles as by merely applying to the sintered sheet or disc a slurry of the particles suspended in water or other volatile liquid. The presence of 1 to 5% resin binder in the liquid, based on the weight of the suspended particles, helps retain them in place after they are impregnated into the pores. Such particles are preferably about 1 mil or less in thickness, and the pores at least about 3 times the particles size. The porous sheet or disc can thus be sintered from particles at least about 10 mils in diameter so as to contain such large voids.

Alternatively the pyrophorically activated particles can be mixed with the non-pyrophoric combustible particles and the mixture thus sintered into the desired finished structure. In this modification powdered 100 mesh magnesium is for example mixed with one-half to twice its weight of minus 180 mesh pyrophoric iron or nickel powder, and the mixture first compacted under argon at 10,000 pounds per square inch into a disc about 5 mils thick, and then sintered at about 600° C. Only about 30 minutes at that temperature is sufficient. Higher temperatures can be used with other materials, but may cause excessive thermal deterioration of the pyrophoric particles and should be limited to shorter times.

Other particles such as of boron, zirconium and the like can be included in the mixture being sintered, even though these other particles do not significantly sinter together under the sintering conditions, so long as they are not in such large proportions as to prevent the sintering of the sinterable particles. For the greatest thermal output a high boron content is desired, at least 20% by weight, and some easily ignited metal such as magnesium, titanium or zirconium can be used to be more readily ignited by the pyrophoric particles. Because the non-pyrophoric particles act as heat sinks, the content of pyrophoric particles should be at least ⅓ by weight in order to reach the necessary ignition temperature, at least in one portion of the sintered member. Pyrophoric nickel particles are somewhat more effective than pyrophoric iron particles in igniting non-pyrophoric particles.

The compacted and/or sintered mixtures can be made using pyrophoricity-developing particles that are not leached until the compacting and/or sintering is completed, but the products produced this way are less effective.

The sintered products can have their pyrophoricity blocked by the same coatings or atmospheres used to preserve pyrophoric foils. Moreover by combining two different types of coatings, enhanced blocking effects are obtainable. Thus dipping an activated iron or nickel foil in a 30% aqueous dispersion of colloidal silica, followed by removal and drying of the dipped foil, leaves a foil surface that more slowly generates pyrophoric heat. The heat dwell is made a few seconds longer and the peak temperature reached can be almost 100° F. lower. However when 10 to 90% of the silica in the dispersion is replaced by the triethanolamine chelate of diproproxy titanium, the pyrophoricity-blocking effect is much more pronounced. The heat dwell can then be extended about 40% while the peak temperature drops a little over 200° F. A mixture of about 2 parts silica and about 3 parts chelate, is preferred.

The foregoing chelate has the formula

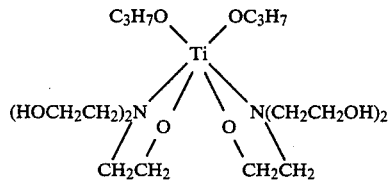

Triethanolamine, diethanolamine or monoethanolamine can be mixed with the colloidal silica to give effects similar to those of the chelate, and colloidal alumina can be correspondingly substituted for the colloidal silica, as can colloidally-sized, i.e. submicron-sized, particles of other inert solids.

The continuous diffusion process of FIGS. 1, 2 and 3, as well as of parent application Ser. No. 172,671, provides a speedier diffusion coating than conventional batch processes. It appears that in such continuous diffusion, activator is continually being added to the diffusion coating retort so that the activator is somewhat more effective. As a result the diffusion-coating time and/or temperature needed, is lower than normal.

Thus only about 15 minutes at 1600° F. will yield an aluminized diffusion case 1 mil thick on a steel foil, using a diffusion-coating powder as in FIG. 3 containing only ½% NH₄Cl activator. Such a diffusion case, when leached with caustic soda for 30 minutes, leaves the substrate foil highly pyrophoric.

Batch treatment of short lengths of foil in individual retorts, as in U.S. Pat. No. 3,824,122 but with the individual retorts loosely covered, requires a 1650° F. diffusion temperature to obtain comparable results.

The activator greatly speeds the transfer of diffusion-coating metal from the diffusion-coating powder to the surface of the substrate being coated. In a conventional commercial batch operation the activator is vaporized and driven out of the diffusion-coating retort as the retort heats up, so that the activator remaining at the end of the heat is at an extremely low concentration. The continuous addition of activator as in the continuous process of the present invention accordingly yields a case with its outer surface somewhat richer in diffusing metal.

Increasing the content of activator in a conventional batch process has a similar effect, but is not as marked.

When diffusion coating a continuous substrate less than about five mils thick, the heat conducted away by such thin material is almost insignificant, so that the heating up and the cooling down can readily be accomplished in seconds.

The foregoing improvements in diffusion speed are also obtained with other diffusing-in metals such as chromium, zinc and nickel, and with vaporizable activators of any kind including the ammonium halides and aluminum chloride, bromide and iodide.

Pyrophoric particles can also be obtained by leaching alloy particles prepared by diffusion coating or alloying, iron or nickel powder or other similar powders. Thus iron or nickel or cobalt powder is readily diffusion aluminized in a diffusion coating retort in which such powder and aluminum powder are heated to diffusion coating temperature, preferably in contact with a vaporized diffusion coating activator. This is illustrated in the following example:

EXAMPLE I 40 grams minus 325 mesh iron powder are mixed with 60 grams similarly sized aluminum powder and 1 gram anhydrous aluminum chloride powder, and the mixture placed in a steel retort, the retort loosely covered and placed in a larger retort through which a stream of argon flushes. The retort assembly is then inserted in a furnace, heated to 1200° F. and kept there for 1½ hours. During the initial heat-up, a stream of hydrogen is substituted for the stream of argon. After cool down the powder particles have sintered together to a large degree, and the resulting masses are ground, as with a chopper blade such as used in a micro-mill type grinder, to very fine particle size, for example 325 mesh. These particles can be screened out, if desired and constitute particles that can be somewhat larger in size than the original particles. These aluminized particles can now be subjected to a caustic leach treatment to produce highly pyrophoric iron powder the particles of which are about the same overall size as the aluminized particles. The grinding can be controlled to provide activated particles of larger or smaller size.

To reduce the tendency for the particles to sinter together during the diffusion coating, the diffusion temperature can be lowered to as low as about 800° F., and/or inert refractory particles such as alumina powder can be mixed with the iron and aluminum powders. After such a mixture has completed its diffusion coating treatment or the leaching treatment, the inert alumina can be separated out magnetically. The aluminized iron and the leached iron particles are magnetic whereas the alumina particles are non-magnetic so that pouring a stream of the mixtures through a magnetic field causes the iron particles to be deflected away from the alumina particles. There may be some tendency for fine alumina or other refractory particles to physically adhere to the diffusion-coated iron particles, in which event the diffusion-coated mixture can be forcefully agitated in water preferably containing a little surface active agent to wash the fine alumina or the like off the heavier iron particles and permit those heavier particles to settle out.

Powdered pyrophoric metal or powdered precursor alloys can also be separated from inert diluents or other ingredients in diffusion coating packs by having different sizes for the particles to be separated and sieving the mixture to effect the separation. Thus cobalt balls at least about 20 mils in diameter can be diffusion coated in a pack whose particles are all smaller than 2 mils thick. Such diffusion coating can be for purposes other than the preparation of pyrophoric articles, and is suitable for chromizing, tantalizing, boronizing, nickelizing etc. Cobalt balls that are first chromized and then aluminized by powder packs as described in column 3 of U.S. Pat. No. 4,041,196 are highly suited for the flue treatment described in U.S. Pat. No. 4,254,616.

Where the case to be formed by the diffusion coating is very thin, the diffusion coating pack can contain only enough coating metal to form the desired case thickness, so that the coating metal is entirely or substantially entirely depleted by the time the diffusion coating step is completed. This makes it a little easier to effect the separation of the coated substrate particles.

The substrate particles can also have a substantially higher density than the pack particles so that the final separation of coated substrate is by density difference, such as by stratification with a liquid of intermediate density or by causing a stream of the pack powder, after the coating completion, to fall through a transversely blowing stream of air. The transversely moving air carries the less dense particles to one side much further than the denser particles. Such a separating technique is particularly desirable with low temperature aluminizing, because the aluminum powder then remaining in the coating pack has a density much lower than most substrate metals.

The ignition temperatures referred to above are the lowest temperatures at which the metals there discussed ignite in air. Pyrophoric metals react and ignite at extremely low temperatures and are accordingly not considered as having an ignition temperature. When an ignition temperature is mentioned, it is accordingly in connection with a material that is not pyrophoric. Carbon and boron, both of which are ignited by the pyrophoric metals, can be considered ignitable metals for the above purposes.

Finely divided pyrophoric nickel can be prepared by substituting nickel powder for the iron powder of Example I.

The treatments described above for increasing or tempering the pyrophoric effects of pyrophorically-activated surfaces are applicable to those surfaces whether they are activated or treated by a continuous process or by a batch process. Examples of some desirable batch processes include the open-coil treatment described in parent application Ser. No. 25,456.

The pyrophoric surfaces of the present invention are also catalytic, and this catalytic characteristic is not destroyed if the pyrophoricity is diminished or even completely eliminated. Thus treatment of these pyrophoric surfaces with 3% aqueous $H_2O_2$ will eliminate all pyrophoricity but the resulting surfaces are still highly catalytic. Indeed such catalytic function is particularly desirable for use under conditions in which they are subjected to a reducing rather than oxidizing environment. Nickel cathode electrodes prepared that way are thus very long-lived over-voltage diminishers, and platinum or platinum-5% rhodium screens are long-lived high temperature catalysts for HCN synthesis. It appears that some activating metal such as aluminum is still present in these catalytic surfaces and under oxidizing conditions this residual metal gradually degrades the catalytic nature.

The magnesium-containing mixtures of the present invention, and particularly the iron-magnesium-containing mixtures may be used for the purposes described in U.S. Pat. No. 4,264,362.

Obviously many modifications and variations of the present invention are possible in the light of the above teachings. It is therefore to be understood that within the scope of the appended claims the invention may be practiced otherwise than as specifically described.

What is claimed:

1. A metal foil less than 10 mils thick having a porous pyrophoric surface, the pyrophoricity of that surface being partially blocked by an added stratum of colloidally sized inert particles.

2. The combination of claim 1 in which the added stratum includes an ethanolamine compound.

3. A pyrophoric compact essentially of pyrophoric iron powder and easily ignited combustible boron, the proportion of the pyrophoric powder being large enough so that when the member is exposed to oxygen the powder generates sufficient heat to ignite the boron.

* * * * *